United States Patent
Won et al.

(10) Patent No.: US 8,559,620 B2
(45) Date of Patent: Oct. 15, 2013

(54) COMMUNICATIONS CIRCUIT FOR REDUCING CROSSTALK

(75) Inventors: Jun Goo Won, Gyunggi-do (KR); Youn Suk Kim, Gyunggi-do (KR); Ki Joong Kim, Jeollabuk-do (KR); Jae Hyouck Choi, Gyunggi-do (KR); Young Jean Song, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 206 days.

(21) Appl. No.: 13/177,904

(22) Filed: Jul. 7, 2011

(65) Prior Publication Data
US 2012/0038420 A1    Feb. 16, 2012

(30) Foreign Application Priority Data
Aug. 16, 2010    (KR) .................. 10-2010-0078779

(51) Int. Cl.
*H04M 1/76*    (2006.01)
*H02J 1/00*    (2006.01)
*H03H 7/38*    (2006.01)

(52) U.S. Cl.
USPC .............................. 379/417; 307/30; 333/129

(58) Field of Classification Search
None
See application file for complete search history.

(56) References Cited

U.S. PATENT DOCUMENTS

| | | | |
|---|---|---|---|
| 2007/0085108 A1* | 4/2007 | White et al. .................. | 257/173 |
| 2008/0136559 A1* | 6/2008 | Takahashi et al. ............ | 333/167 |
| 2010/0033287 A1* | 2/2010 | Kim et al. .................... | 336/200 |

FOREIGN PATENT DOCUMENTS

| | | |
|---|---|---|
| KR | 10-2005-0012914 A | 2/2005 |
| KR | 10-2006-0071916 | 6/2006 |
| KR | 10-0882131 B1 | 2/2009 |

OTHER PUBLICATIONS

Korean Office Action, with English translation, issued in Korean Patent Application No. 10-2010-0078779, dated Nov. 29, 2011.

* cited by examiner

*Primary Examiner* — Simon Sing
*Assistant Examiner* — Jeffrey Lytle
(74) *Attorney, Agent, or Firm* — McDermott Will & Emery LLP

(57) ABSTRACT

There is provided a communications circuit for reducing crosstalk. The communications circuit for reducing crosstalk may include: a conductive power supply pattern supplying driving power applied from the outside; a first transformer implemented as an integrated passive device (IPD) type having a first input conductive line receiving a first signal of a low-frequency band received from a first power amplifier and a first output conductive line close to the first input conductive line and electromagnetically coupled with the first input conductive line, and receiving the driving power supplied from the conductive power supply pattern through a terminal formed on the first input conductive line; and a second transformer implemented as the IPD type having a second input conductive line receiving a second signal of a high-frequency band received from a second power amplifier and a second output conductive line close to the second input conductive line and electromagnetically coupled with the second input conductive line, and receiving the driving power supplied from the conductive power supply pattern through a terminal formed on the second input conductive line, and the conductive power supply pattern may include an inductor component. Therefore, crosstalk between the low-frequency band and the high-frequency band can be reduced.

5 Claims, 2 Drawing Sheets

COMMUNICATIONS CIRCUIT FOR REDUCING CROSSTALK

CROSS-REFERENCE TO RELATED APPLICATIONS

This application claims the priority of Korean Patent Application No. 10-2010-0078779 filed on Aug. 16, 2010, in the Korean Intellectual Property Office, the disclosure of which is incorporated herein by reference.

BACKGROUND OF THE INVENTION

1. Field of the Invention

The present invention relates to a communications circuit for reducing crosstalk, and more particularly, to a communications circuit for reducing crosstalk between a low-frequency band and a high-frequency band by adding an inductor component to a conductive power supply pattern supplying power to a first integrated passive device of the low-frequency band and a second integrated passive device of the high-frequency band.

2. Description of the Related Art

In general, transmitters in mobile communications terminals such as a cellular phone and the like, include power amplifiers for amplifying the power of a transmission signal and the power amplifiers amplify the transmission signal to an appropriate level of electric power. The power amplifiers generally perform matching and couple electric powers by using transformers each having two or more input conductive lines and one output conductive line.

In order to improve the performance of mobile communications terminals including power amplifiers and the transformers, research into reducing crosstalk that occurs between different frequency bands in a communications module of limited size is actively being carried out. Herein, crosstalk refers to a phenomenon in which a harmonic component of a low-frequency band crosses to a high-frequency band. In particular, in a global system for mobile communications (GSM) terminal, since a low-frequency band of 900 MHz and a high-frequency band of 1.8 GHz are used together, the reduction of crosstalk is a very important issue.

SUMMARY OF THE INVENTION

An aspect of the present invention provides a communications circuit capable of reducing crosstalk between a low-frequency band and a high-frequency band.

According to an aspect of the present invention, there is provided a communications circuit for reducing crosstalk including: a conductive power supply pattern supplying driving power applied from the outside; a first transformer implemented as an integrated passive device (IPD) type having a first input conductive line receiving a first signal of a low-frequency band received from a first power amplifier and a first output conductive line close to the first input conductive line and electromagnetically coupled with the first input conductive line, and receiving the driving power supplied from the conductive power supply pattern through a terminal formed on the first input conductive line; and a second transformer implemented as the IPD type having a second input conductive line receiving a second signal of a high-frequency band received from a second power amplifier and a second output conductive line close to the second input conductive line and electromagnetically coupled with the second input conductive line, and receiving the driving power supplied from the conductive power supply pattern through a terminal formed on the second input conductive line, and the conductive power supply pattern includes an inductor component.

The conductive power supply pattern may have a structure separated into a first conductive power supply pattern supplying the driving power to the first transformer and a second conductive power supply pattern supplying the driving power to the second transformer.

Specifically, the first conductive power supply pattern and the second conductive power supply pattern may include serpentine patterns, triangular-wave patterns, or quadrangular-wave patterns.

Further, the first signal may be a low-frequency signal of a 900 MHz band and the second signal may be a high-frequency signal of a 1.8 GHz band.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
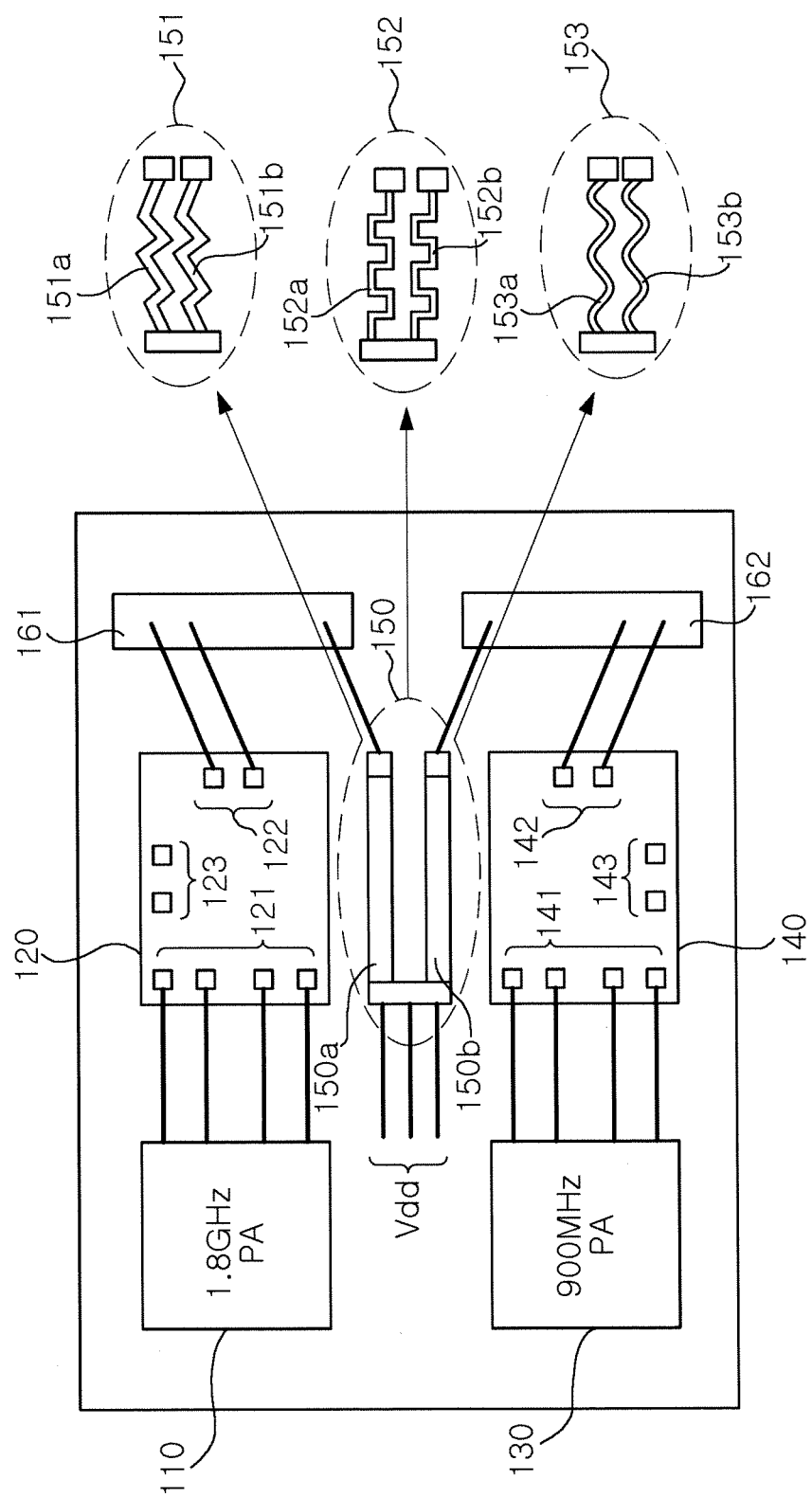
FIG. 1 is a diagram showing a communications circuit for reducing crosstalk according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. While those skilled in the art could readily devise many other varied embodiments that incorporate the teachings of the present invention through the addition, modification or deletion of elements, such embodiments may fall within the scope of the present invention.

The same or equivalent elements are referred to by the same reference numerals throughout the specification.

Figure 2:
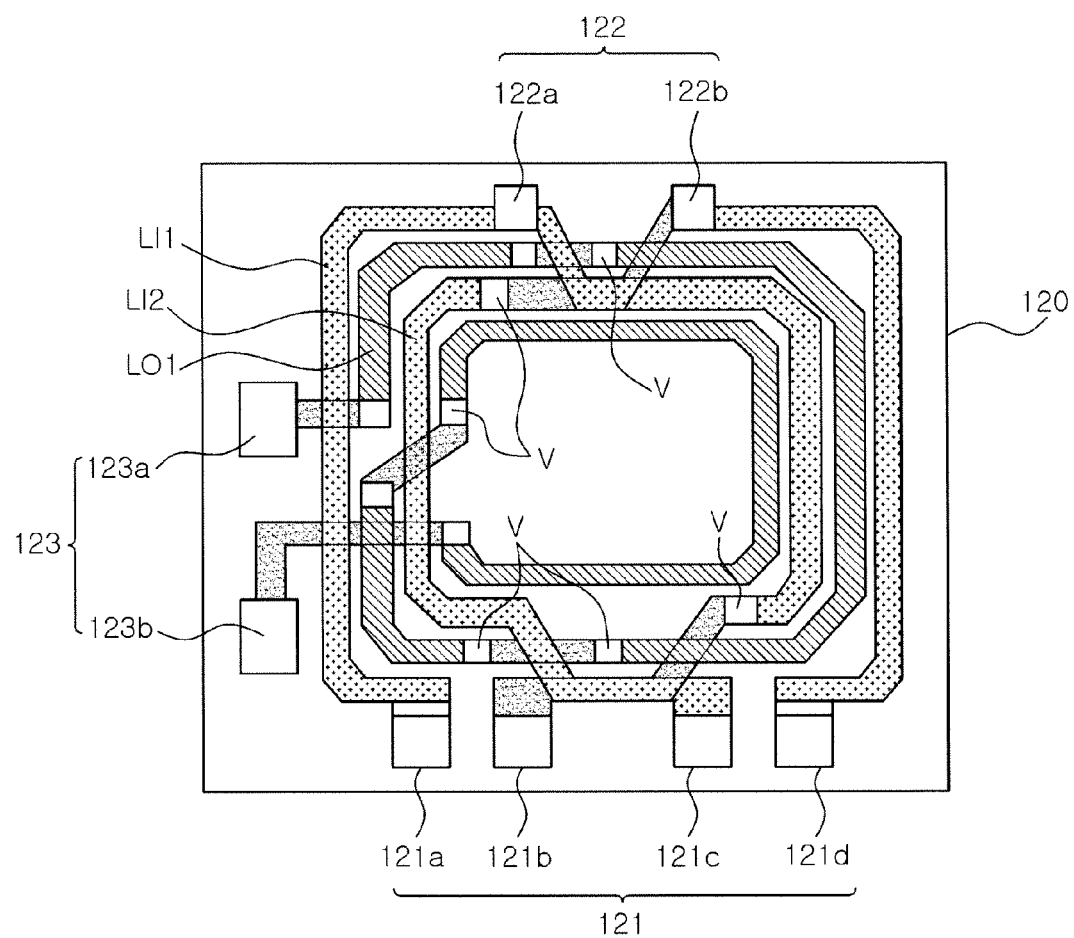
FIG. 2 is a diagram illustrating the structure of a transformer 120 of FIG. 1.

FIG. 1 is a diagram showing a communications circuit for reducing crosstalk according to an exemplary embodiment of the present invention, and FIG. 2 is a diagram illustrating the structure of a transformer 120 of FIG. 1.

Referring to FIG. 1, a communications circuit for reducing crosstalk according to an exemplary embodiment of the present invention may include high-frequency modules 110 and 120, low-frequency modules 130 and 140, and a conducive power supply pattern 150 for supplying driving power Vdd to the low-frequency modules 130 and 140 and the high-frequency modules 110 and 120.

The low-frequency modules 130 and 140 may include a first power amplifier 130 receiving and amplifying a first signal of a low frequency of 900 MHz and thereafter, transferring the amplified signal to a first transformer 140, and the first transformer 140 coupling and outputting the first signal received from the first power amplifier 130.

The high-frequency modules 110 and 120 may include a second power amplifier 110 receiving and amplifying a second signal of a high frequency of 1.8 GHz and thereafter, transferring the amplified signal to a second transformer 120, and the second transformer 120 coupling and outputting the second signal received from the second power amplifier 110.

Since the first transformer 140 and the second transformer 120 have the same structure, the second transformer 120 will now be primarily described in terms of the simplification of the present invention.

Referring to FIG. 2, the second transformer 120 according to the exemplary embodiment may include a lamination substrate, input conductive lines LI1 and LI2 connected to input ports 121a, 121b, 121c, and 121d, and an output conductive line LO1 connected to output ports 123a and 123b.

The lamination substrate may be a dielectric substrate having a plurality of layers. As shown in FIG. 2, the input conductive lines LI1 and LI2 and the output conductive line LO1 are disposed on the same plane of the substrate in a circumferential direction of the substrate, and a plurality of via holes V are formed on the substrate in order to prevent the input conductive lines LI1 and LI2 and the output conductive line LO1 from being short-circuited due to direct contact with each other. As the lamination substrate, a high-frequency substrate may be used.

Meanwhile, the input conductive lines LI1 and LI2 are formed on the substrate and ends of the input conductive lines LI1 and LI2 are connected to two pairs of input ports 121a and 121b and 121c and 121d formed on the substrate to be provided as input terminals of respective positive '+' and negative '−' signals. In the exemplary embodiment, ports 121a, 121b, 121c, and 121d of both ends of two respective input conductive lines LI1 and LI2 may be connected to the power amplifier 110. Further, the power Vdd may be supplied to each of the input conductive lines LI1 and LI2 through the conductive power supply pattern 150. In the transformer of the exemplary embodiment, the input conductive lines may be connected to a power amplifier implemented as a CMOS type used in a mobile communications terminal.

The output conductive line LO1 is close to each of the input conductive lines LI1 and LI2 to be electromagnetically coupled with the input conductive lines LI1 and LI2 and one end of the output conductive line LO1 may be connected to a ground GND through the output port 123a or 123b. Through current supplied to the input conductive lines LI1 and LI2, magnetically induced current may be generated in the output conductive line LO1.

Further, in the exemplary embodiment of the present invention, power supplying pads 122a and 122b may be formed on portions of two input conductive lines LI1 and LI2, respectively. The power supplying pads 122a and 122b may be provided as terminals for supplying the power Vdd to the input conductive lines LI1 and LI2, respectively. Positions at which the power supplying pads 122a and 122b are formed may be positions on the input conductive lines LI1 and LI2 where an electric RF swing potential is 0V. Since the CMOS power amplifier has no DC-based ground, the CMOS power amplifier uses an AC-based ground. The RF swing potential of 0V means the AC-based ground. The second transformer 120 may be implemented as an example of an integrated passive device (IPD).

Meanwhile, the conductive power supply pattern 150 supplies the driving power Vdd applied from the outside to the input conductive lines LI1 and LI2 of each of the transformers 120 and 140, as shown in FIG. 1. Specifically, the driving power Vdd is applied to the conductive power supply pattern 150 and the driving power Vdd applied to the conductive power supply pattern 150 is supplied to the power supplying pads 122a and 122b formed on the input conductive lines LI1 and LI2 of each of the transformers 120 and 140 through a conductive bar 161 or 162 disposed on the side.

According to an exemplary embodiment of the present invention, the conductive power supply pattern 150 is separated into a first conductive power supply pattern 150b for the first transformer 140 and a second conductive power supply pattern 150a for the second transformer 120 to increase the length of the conductive power supply pattern 150, thereby increasing an inductor component. That is, by increasing the length of the conductive power supply pattern 150, crosstalk that occurs due to the transferring of a harmonic component of the amplifier 130 of a low-frequency signal to the amplifier 110 of a high-frequency signal can be reduced.

Further, according to another exemplary embodiment of the present invention, in order to include the inductor component, the conductive power supply pattern 150 maybe formed in various embodiments.

According to a first exemplary embodiment of the present invention, as shown in reference numeral 151, the first conductive power supply pattern 150b and the second conductive power supply pattern 150a may be formed by triangular-wave patterns 151b and 151a.

According to a second exemplary embodiment of the present invention, as shown in reference numeral 152, the first conducive power supply pattern 150b and the second conductive power supply pattern 150a may be formed by quadrangular-wave patterns 152b and 152a.

According to a third exemplary embodiment of the present invention, as shown in reference numeral 153, the first conducive power supply pattern 150b and the second conductive power supply pattern 150a maybe formed by serpentine patterns 153b and 153a.

The shapes of the conductive patterns are merely one exemplary embodiment, and the conductive patterns may be implemented to have various shapes according to the needs of those skilled in the art.

As set forth above, crosstalk between a low-frequency band and a high-frequency band can be reduced by adding an inductor component to a conductive power supply pattern supplying power to a first integrated passive device of the low-frequency band and a second integrated passive device of the high-frequency band.

While the present invention has been shown and described in connection with the exemplary embodiments, it will be apparent to those skilled in the art that modifications and variations can be made without departing from the spirit and scope of the invention as defined by the appended claims.

What is claimed is:

1. A communications circuit for reducing crosstalk, comprising:
  a conductive power supply pattern supplying driving power applied from the outside;
  a first transformer implemented as an integrated passive device (IPD) type transformer with a first input conductive line receiving a first signal of a low-frequency band from a first power amplifier where a first output conductive line disposed adjacent the first input conductive line to be electromagnetically coupled to the first input conductive line and receiving the driving power supplied from the conductive power supply pattern through a terminal formed on the first input conductive line; and
  a second transformer implemented as the IPD type transformer with a second input conductive line receiving a second signal of a high-frequency band from a second power amplifier where a second output conductive line disposed adjacent the second input conductive line to be electromagnetically coupled to the second input conductive line and receiving the driving power supplied from the conductive power supply pattern through a terminal formed on the second input conductive line,
  wherein the conductive power supply pattern includes an inductor component, and the conductive power supply pattern has a structure separated into a first conductive power supply pattern supplying the driving power to the first transformer and a second conductive power supply pattern supplying the driving power to the second transformer.

2. The communications circuit for reducing crosstalk of claim 1, wherein the first conductive power supply pattern and the second conductive power supply pattern include serpentine patterns.

3. The communications circuit for reducing crosstalk of claim 1, wherein the first conductive power supply pattern and the second conductive power supply pattern include triangular-wave patterns.

4. The communications circuit for reducing crosstalk of claim 1, wherein the first conductive power supply pattern and the second conductive power supply pattern include quadrangular-wave patterns.

5. The communications circuit for reducing crosstalk of claim 1, wherein the first signal is a low-frequency signal of a 900 MHz band and the second signal is a high-frequency signal of a 1.8 GHz band.

* * * * *